(12) United States Patent
Marini

(10) Patent No.: US 11,875,092 B2
(45) Date of Patent: Jan. 16, 2024

(54) PART FEATURING A BUMP

(71) Applicant: DASSAULT SYSTEMES, Velizy-Villacoublay (FR)

(72) Inventor: Laurent Marini, Velizy-Villacoublay (FR)

(73) Assignee: DASSAULT SYSTEMES, Velizy-Villacoublay (FR)

( * ) Notice: Subject to any disclaimer, the term of this patent is extended or adjusted under 35 U.S.C. 154(b) by 658 days.

(21) Appl. No.: 16/921,844

(22) Filed: Jul. 6, 2020

(65) Prior Publication Data
US 2021/0004510 A1   Jan. 7, 2021

(30) Foreign Application Priority Data

Jul. 4, 2019 (EP) ..................................... 19305916

(51) Int. Cl.
*G06F 30/15* (2020.01)
*G06F 30/12* (2020.01)
(Continued)

(52) U.S. Cl.
CPC .............. *G06F 30/15* (2020.01); *G06F 30/12* (2020.01); *G06T 17/10* (2013.01); *G06T 17/30* (2013.01);
(Continued)

(58) Field of Classification Search
CPC ...... G06F 30/15; G06F 30/12; G06F 3/04817; G06F 30/17; G06F 2111/04;
(Continued)

(56) References Cited

U.S. PATENT DOCUMENTS 8,244,508 B1 *   8/2012   Dean ....................... G06T 17/10
                                                        700/98
8,872,820 B2    10/2014   Bohman et al.
(Continued)

FOREIGN PATENT DOCUMENTS

EP    2028623 A1 *  2/2009  ............. G06F 17/10
EP    1710720 B1 *  7/2009  ............. G06F 17/50
(Continued)

OTHER PUBLICATIONS

Manfredo P. Do Carmo; "Differential Geometry of Curves and Surfaces"; Prentice-Hall, Inc.; Englewood Cliffs, New Jersey: 1976; (511 pgs.).

(Continued)

*Primary Examiner* — Kandasamy Thangavelu
(74) *Attorney, Agent, or Firm* — Oblon, McClelland, Maier & Neustadt, L.L.P.

(57) ABSTRACT

A computer-implemented method for designing, with a CAD system, a 3D modeled object representing a mechanical part. The method includes displaying a B-rep having faces and edges and representing at least a part of the mechanical part, selecting, by graphical user interaction, at least one face of the B-rep, and, automatically by the CAD system, recognizing a set of faces including the at least one face and representing a bump. The recognizing includes determining a first set of faces representing a depression and a second set of faces representing a protrusion, and selecting, among the first set of faces and the second set of faces, a set of faces having a shortest boundary curve perimeter and being different from both the selected at least one face and the B-rep. The first set of faces and the second set of faces both comprise the at least one face.

20 Claims, 13 Drawing Sheets

(51) Int. Cl.
*G06T 17/10* (2006.01)
*G06T 17/30* (2006.01)

(52) U.S. Cl.
CPC ...... *G06T 2200/24* (2013.01); *G06T 2210/12* (2013.01)

(58) Field of Classification Search
CPC ..... G06F 2119/18; G06T 17/10; G06T 17/30; G06T 2200/24; G06T 2210/12; G06T 17/00; G06V 20/64; G06V 30/422
See application file for complete search history.

(56) References Cited

U.S. PATENT DOCUMENTS

| | | | |
|---|---|---|---|
| 2011/0282632 A1 | 11/2011 | Rameau et al. | |
| 2014/0184594 A1 | 7/2014 | Janvier | |
| 2017/0160726 A1* | 6/2017 | Rameau | G05B 19/4097 |
| 2017/0220730 A1* | 8/2017 | Marini | G06F 30/17 |
| 2018/0129188 A1* | 5/2018 | Jacobs | G05B 19/4093 |

FOREIGN PATENT DOCUMENTS

| | | | | |
|---|---|---|---|---|
| EP | 2521057 A1 * | 11/2012 | ......... | G06F 3/04845 |
| EP | 3 179 389 A1 | 6/2017 | | |
| EP | 3340084 A1 * | 6/2018 | ............. | G06F 30/20 |
| EP | 3460760 A1 * | 3/2019 | ............. | G06T 17/10 |
| JP | 2014509430 A * | 4/2014 | ............. | G06T 19/00 |
| WO | WO 2016/178106 A1 | 11/2016 | | |

OTHER PUBLICATIONS

Extended Search Report dated Aug. 12, 2019 in European Patent Application No. 19305126.5-1224; 10 pages.
Extended Search Report dated Jan. 27, 2020 in European Patent Application No. 19305916.9-1224; 15 pages.
T. Lim, et al.; "Edge-Based Identification of DP-Features on Free-Form Solids"; IEEE Transactions on Pattern Analysis and Machine Intelligence, IEEE Computer Society, USA; vol. 27, No. 6, Jun. 1, 2005; XP011131012; 10 pgs.
Chunjie ZHANG, et al.; "Feature Extraction from Freeform Molded Parts for Moldability Analysis"; The International Journal of Advanced Manufacturing Technology, Springer, Berlin De; vol. 48, No. 1-4; Sep. 3, 2009; XP019797880; ISSN:1433-3015; 10 pgs.
Jiing-Yih Lai, et al.; "Recognition of Depression and Protrusion Features on B-rep Models Based on Virtual Loops"; Computer-Aided Design and Applications; vol. 13, No. 1; Aug. 28, 2015; XP055658648; 13 pgs.
"Onshape—Product Development Platform"; https://www.onshape.com; retrieved Jul. 3, 2020; 11 pgs.
"Commercial CAD System NX9"; https://www.plm.automation.siemens.com/global/en/products/nx/, retrieved Jul. 3, 2020; 9 pgs.
"Design Engineering CATIA—Dassault Systemes"; https://www.3ds.com/products-services/catia/?wockw=card_content_cta_1_url%3Ahttps%3A%2F%2Fblogs.3ds.com%2Fcatia%2F; retrieved Jul. 3, 2020; 11 pgs.
Li, J., et al., "Automatic small depression feature recognition from solid B-rep models for meshing." 2011 International Conference on Electrical and Control Engineering. IEEE, 2011, pp. 4386-4389.
Zhu, H., et al., "B-rep model simplification by automatic fillet/round suppressing for efficient automatic feature recognition." Computer-Aided Design 34.2, 2002, pp. 109-123.
Sunil, V.B., et al., "An approach to recognize interacting features from B-Rep CAD models of prismatic machined parts using a hybrid (graph and rule based) technique." Computers in Industry 61.7, 2010, pp. 686-701.

* cited by examiner

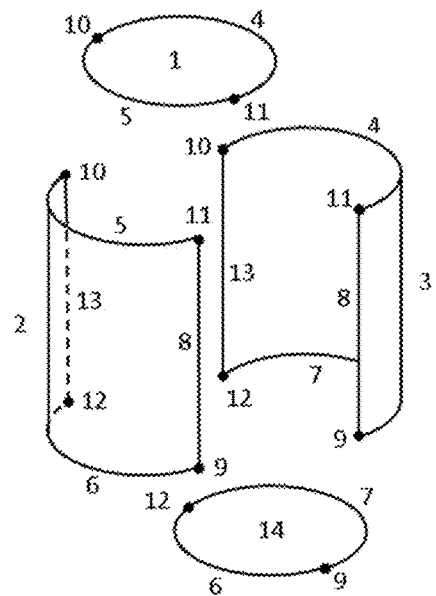
FIG. 6
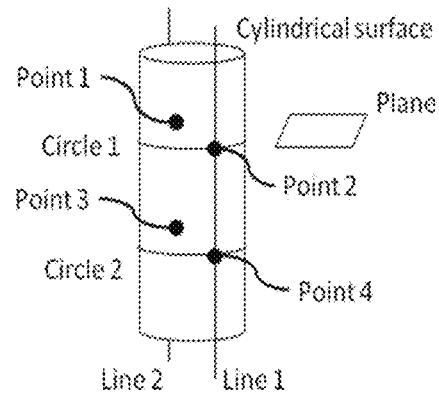
FIG. 7
FIG. 8
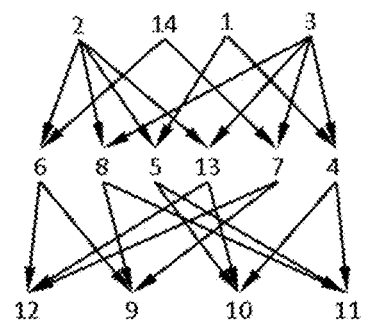
FIG. 9

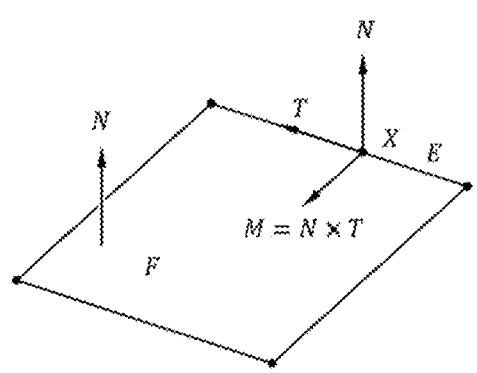
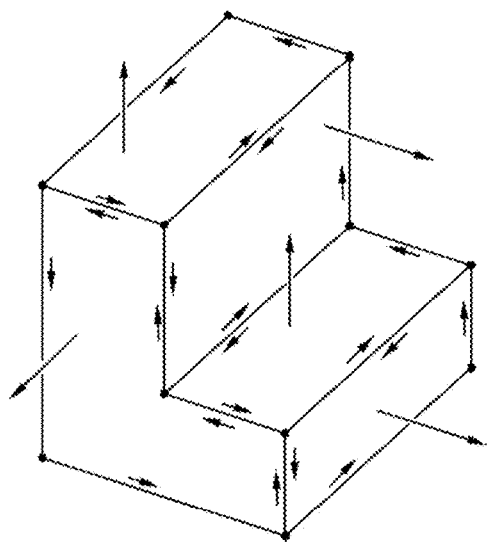
FIG. 10  FIG. 11
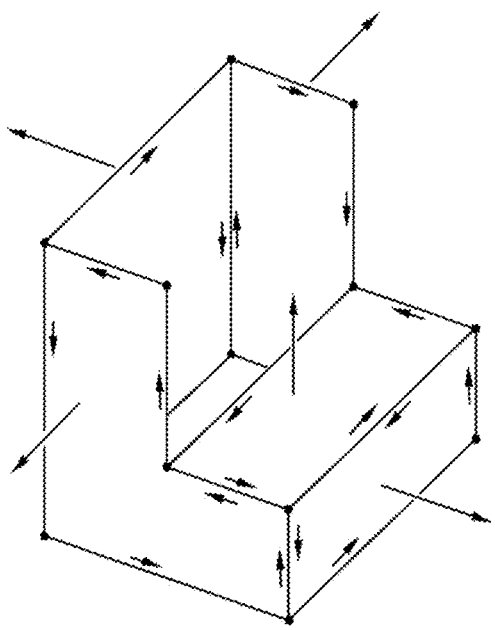
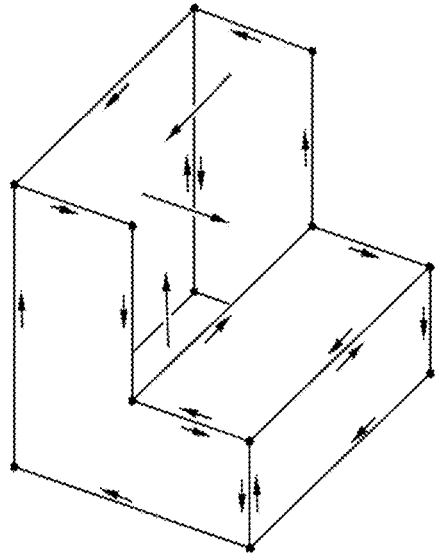
FIG. 12  FIG. 13

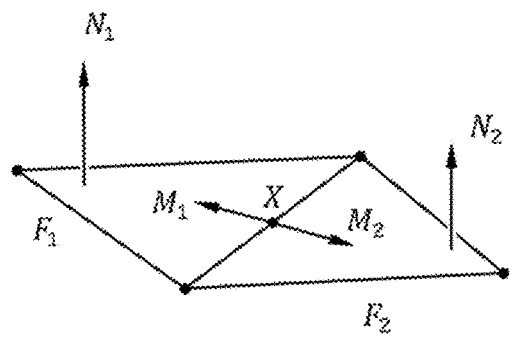
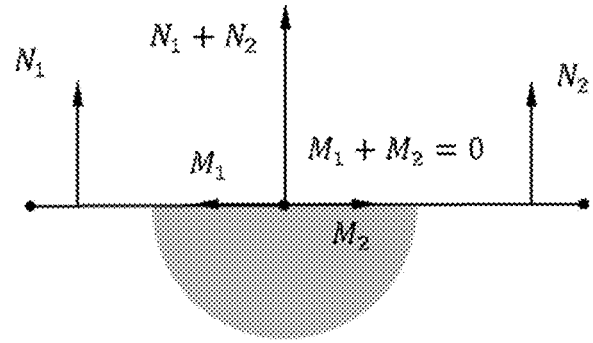
FIG. 18
FIG. 19
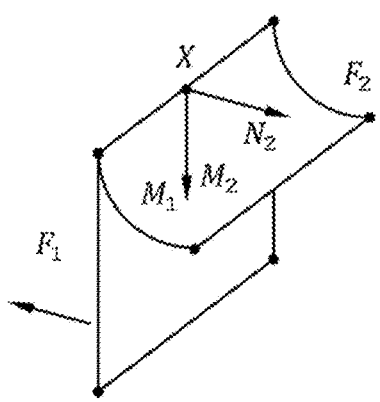
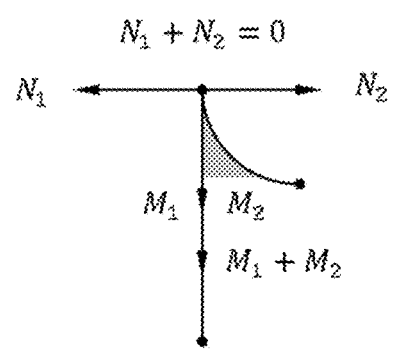
FIG. 20
FIG. 21

PART FEATURING A BUMP

CROSS-REFERENCE TO RELATED APPLICATIONS

This application claims priority under 35 U.S.C. § 119 or 365 to European Application No. 19305916.9, filed Jul. 4, 2019. The entire contents of the above application(s) are incorporated herein by reference.

FIELD OF THE INVENTION

The disclosure relates to the field of computer programs and systems, and more specifically to a method, system and program for designing, with a CAD system, a 3D modeled object representing a mechanical part.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systèmes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

In the mechanical design context, a bump is a functional feature represented by faces of a B-rep representing at least a part of a mechanical part. It can be difficult to recognize and/or select all faces representing the bump.

Existing methods for bump recognition and/or selection suffer from a lack of efficiency and/or ergonomics.

Within this context, there is still a need for an improved method for designing a mechanical part.

SUMMARY OF THE INVENTION

It is therefore provided a computer-implemented method for designing, with a CAD system, a 3D modeled object representing a mechanical part. The method comprises displaying a B-rep representing at least a part of the mechanical part. The B-rep has faces and edges. The method further comprises selecting, by graphical user interaction, at least one face of the B-rep. The method further comprises, automatically by the CAD system, recognizing a set of faces. The set of faces comprises the selected at least one face. The set of faces represents a bump. The recognizing of the set of faces includes determining a first set of faces and a second set of faces. The first set of faces and the second set of faces both comprise the at least one face. The first set of faces represents a depression and the second set of faces represents a protrusion. The recognizing of the set of faces further includes selecting, among the first set of faces and the second set of faces, a set of faces having a shortest boundary curve perimeter and being different from both the selected at least one face and the B-rep.

This constitutes an improved method for designing a mechanical part.

Notably, the method allows to recognize a set of faces representing a bump in the B-rep. In other words, the method allows to determine information relevant to mechanical design. Notably, once recognized, the set of faces representing the bump may be outputted to the user, so that design operations can be performed on it. The method may further comprise performing a single design operation on all faces and/or edges of the bump automatically and in a unified way.

Besides, the method recognizes the set of faces automatically. In other words, the method does not involve user-actions at said recognition. The method is thus ergonomic.

In addition, the method proceeds in two steps, first by selecting at least one face, and then, by recognizing a set of faces which comprises the selected at least one face and which represents a bump. This two-step approach improves efficiency and ergonomics, as it is sufficient for the user to select only a part of the bump (i.e. the at least one face) in order for the bump to be automatically recognized.

This two-step approach allows in fact the user to select the at least one face in a simple manner, as the at least one face need not consist in all faces each representing the bump. For example, the at least one face may consist in only one face (i.e. a single face). Then, the automatic recognizing of the set of faces may deduce (e.g. iteratively) the set of faces from the selected at least one face. In other words, the automatic recognizing may iteratively extend the at least one face with neighboring faces until finding the set of faces representing the bump. In other words, it may be sufficient that the user simply selects one face for then automatically recognizing a bump of which the one face represents only a part. This makes the method particularly ergonomic and efficient.

Furthermore, the recognizing of the set of faces itself also proceeds in a two-step approach, first by determining the first set of faces and the second set of faces, and then by selecting one set of faces among them. This makes the method efficient and robust. Indeed, the bump comprising the at least one face may be a protrusion or a depression, but the method recognizes the bump without any knowledge of whether it is a protrusion or a depression. Notably because at least one (e.g. only one) of the first set of faces and the second set of faces is a set of faces truly representing the bump, and the method determines both sets of faces in any case, by looking for both a set representing a protrusion and a set representing a depression (both sets comprising the at least one face). This ensures that at least the one set representing the bump is determined. Then, the selecting of the set representing the bump, among the first set of faces and the second set of faces, allows to output to the user the one set that represents the bump among the two sets. Thus the user obtains the bump he/she wanted to obtain when he/she selected only a small part of it (i.e. the at least one face).

The selecting selects, among the first set of faces and the second set of faces, the set of faces having a shortest boundary curve perimeter and being different from both the selected at least one face and the B-rep. Now, when selecting the at least one face, the user expects a set of faces comprising the at least one face to be recognized. The set of faces is to represent the bump. Thus, the set of faces should not include too many faces, but only the faces representing the bump. Selecting, among the first set of faces and the second set of faces, the one having the shortest boundary curve perimeter, allows to recognize the one that does not include too many faces and that truly represents the bump. This is an efficient manner of selecting, among the two determined sets of faces, the one that truly represents the bump. One may in fact speak of "recognition of a minimal bump comprising the at least one face" or as "extending the at least one face to a minimal bump comprising it". In other words the user is provided with an automatic "minimal bump recognition" upon him/her selecting only a part of the bump he/she wants to selects.

Moreover, the ability of recognizing the bump independently of any knowledge of whether the bump is a protrusion or a depression is particularly advantageous. The user indeed only has to select a small part (i.e. the at least one face) of the bump he/she desires to fully select, and the bump is then automatically recognized, whether it is a protrusion or a depression, which the user may in fact not know. This is all the more advantageous when the B-rep is open, in which case the concepts of protrusion and depression may be visually ambiguous for the user, as further discussed hereinafter.

The method may comprise one or more of the following:
- the first set of faces comprises a first connected set of one or more faces containing no convex internal edge and no round face, and the second set of faces comprises a second connected set of one or more faces containing no concave internal edge and no filet face;
- the first connected set of one or more faces is bounded by convex edges and/or round faces only, and the second connected set of one or more faces is bounded by concave edges and/or filet faces only;
- the first set of faces consists in the first connected set of one or more faces, and the second set of faces consists in the second connected set of one or more faces;
- the at least one face consists in one face of the B-rep;
- a set of faces has a shortest boundary curve relatively to another set of faces if:
  - the boundary curve perimeter of the set of faces is strictly smaller than the boundary curve perimeter of the another set of faces; or
  - the boundary curve perimeter of the set of faces equals the boundary curve perimeter of the another set of faces, and a length of a bounding box of the set of faces is smaller than a length of a bounding box of the another set of faces;
- the selecting of a set of faces comprises:
  - determining:
    - whether either the first set of faces or the second set of faces is the at least one face; and
    - whether either the first set of faces or the second set of faces is the B-rep; then
  - if neither the first set of faces nor the second set of faces is the B-rep, and if neither the first set of faces nor the second set of faces is the at least one face:
    - determining whether the boundary curve perimeter of the first set of faces equals the boundary curve perimeter of the second set of faces; and
    - if the boundary curve perimeter of the first set of faces equals the boundary curve perimeter of the second set of faces, comparing a length of a bounding box of the first set of faces and a length of a bounding box of the second set of faces;
- the B-rep is an open B-rep;
- the B-rep corresponds to a physical surface of the mechanical part;
- the mechanical part is:
  - a molded part;
  - a machined part;
  - a drilled part;
  - a turned part;
  - a forged part;
  - a stamped part; and/or
  - a folded part; and/or
- the bump is:
  - a mass reduction feature;
  - a space reservation feature;
  - a fixture feature;
  - a tightness feature;
  - an adjustment feature;
  - a positioning feature;
  - a mechanical joint feature;
  - a cooling feature;
  - a revolute or cylindrical mechanical joint feature;
  - an assembly feature;
  - a stiffening feature; and/or
  - a support for all machined and drilled protrusion feature.

It is further provided a computer program comprising instructions for performing the method.

It is further provided a computer readable storage medium having recorded thereon the computer program.

It is further provided a system comprising a processor coupled to a memory and a graphical user interface, the memory having recorded thereon the computer program.

BRIEF DESCRIPTION OF THE DRAWINGS

Embodiments will now be described, by way of non-limiting example, and in reference to the accompanying drawings, where:

FIGS. 3, 4, 5, 6, 7, 8, 9, 10, 11, 12, 13, 14, 15, 16, 17, 18, 19, 20, 21, 22, 23, 24, 25, 26, 27, 28, 29, 30, 31 and 32 illustrate the method.

DETAILED DESCRIPTION OF THE INVENTION

Figure 1:
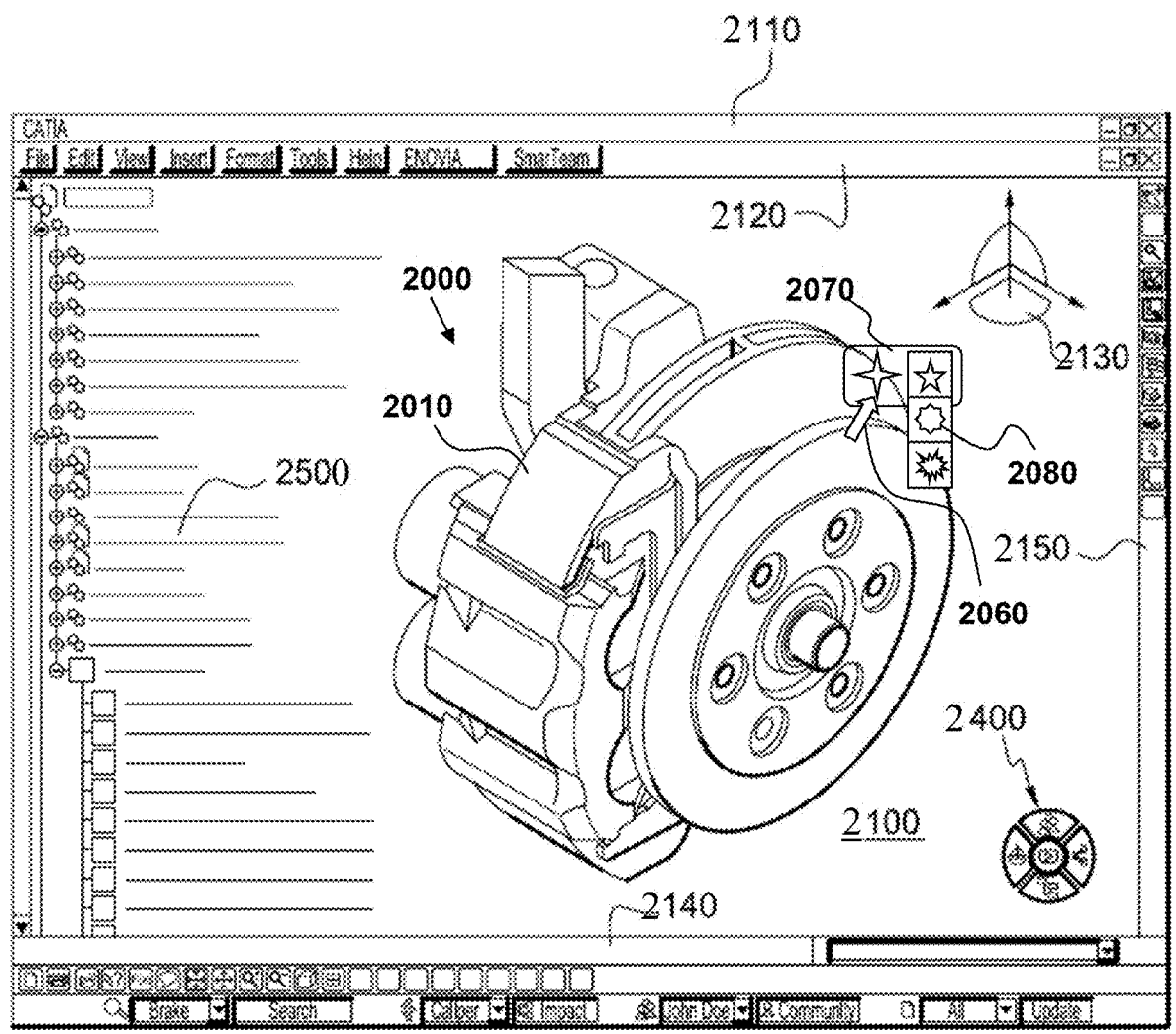
FIG. 1 shows an example of a graphical user interface of the system.

The method is computer-implemented. This means that steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined.

A typical example of computer-implementation of a method is to perform the method with a system adapted for this purpose. The system may comprise a processor coupled to a memory and a graphical user interface (GUI), the memory having recorded thereon a computer program comprising instructions for performing the method. The memory may also store a database. The memory is any hardware adapted for such storage, possibly comprising several physical distinct parts (e.g. one for the program, and possibly one for the database).

The method generally manipulates modeled objects. A modeled object is any object defined by data stored e.g. in the database. By extension, the expression "modeled object" designates the data itself. The system may be a CAD system, and modeled objects are defined by corresponding data. One may accordingly speak of CAD object.

By CAD system, it is additionally meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g. representing a product such as a part or an assembly of parts, or possibly an assembly of products. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

The 3D modeled object may represent the geometry of a product to be manufactured in the real world subsequent to the completion of its virtual design with for instance a CAD software solution or CAD system, such as a (e.g. mechanical) part or assembly of parts (or equivalently an assembly of parts, as the assembly of parts may be seen as a part itself from the point of view of the method, or the method may be applied independently to each part of the assembly), or more generally any rigid body assembly (e.g. a mobile mechanism). A CAD software solution allows the design of products in various and unlimited industrial fields, including: aerospace, architecture, construction, consumer goods, high-tech devices, industrial equipment, transportation, marine, and/or offshore oil/gas production or transportation. The 3D modeled object designed by the method may thus represent an industrial product which may be any mechanical part, such as a part of a terrestrial vehicle (including e.g. car and light truck equipment, racing cars, motorcycles, truck and motor equipment, trucks and buses, trains), a part of an aerial vehicle (including e.g. airframe equipment, aerospace equipment, propulsion equipment, defense products, airline equipment, space equipment), a part of a naval vehicle (including e.g. navy equipment, commercial ships, offshore equipment, yachts and workboats, marine equipment), a general mechanical part (including e.g. industrial manufacturing machinery, heavy mobile machinery or equipment, installed equipment, industrial equipment product, fabricated metal product, tire manufacturing product), an electro-mechanical or electronic part (including e.g. consumer electronics, security and/or control and/or instrumentation products, computing and communication equipment, semi-conductors, medical devices and equipment), a consumer good (including e.g. furniture, home and garden products, leisure goods, fashion products, hard goods retailers' products, soft goods retailers' products), a packaging (including e.g. food and beverage and tobacco, beauty and personal care, household product packaging).

In examples, the mechanical part designed by the method is any one or any combination of a molded part (i.e. a part manufactured by a molding manufacturing process), a machined part (i.e. a part manufactured by a machining manufacturing process), a drilled part (i.e. a part manufactured by a drilling manufacturing process), a turned part (i.e. a part manufactured by a turning manufacturing process), a forged part (i.e. a part manufactured by a forging manufacturing process), a stamped part (i.e. a part manufactured by a stamping manufacturing process) and/or a folded part (i.e. a part manufactured by a folding manufacturing process). The method is particularly efficient for designing such examples of mechanical parts which often comprise bumps. In particular examples of these examples, the mechanical part designed by the method is any one or any combination of a molded part, a turned part, a stamped part and/or a folded part. The method is particularly efficient for designing such examples of mechanical parts which particularly often comprise bumps.

FIG. 1 shows an example of the GUI of the system, wherein the system is a CAD system.

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen. The GUI may for example display data 2500 related to the displayed product 2000. In the example of the figure, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 2:
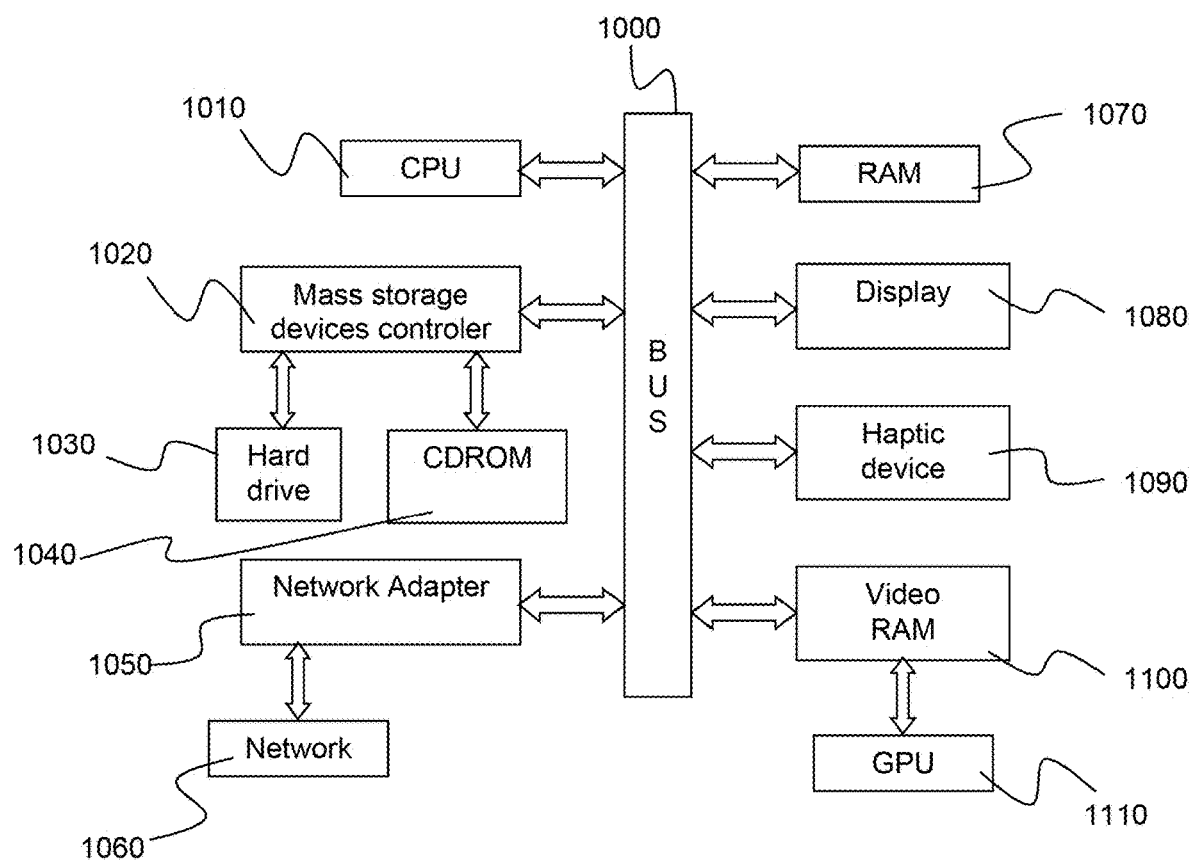
FIG. 2 shows an example of the system.

FIG. 2 shows an example of the system, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

"Designing a 3D modeled object" designates any action or series of actions which is at least part of a process of elaborating a 3D modeled object. Thus, the method may comprise creating the 3D modeled object from scratch. Alternatively, the method may comprise providing a 3D modeled object previously created, and then modifying the 3D modeled object.

The method may be included in a manufacturing process, which may comprise, after performing the method, producing a physical product corresponding to the modeled object. In any case, the modeled object designed by the method may represent a manufacturing object. The modeled object may thus be a modeled solid (i.e. a modeled object that represents a solid). The manufacturing object may be a product, such as a part, or an assembly of parts. Because the method improves the design of the modeled object, the method also improves the manufacturing of a product and thus increases productivity of the manufacturing process.

The displaying of the B-rep representing at least a par to the mechanical part is now discussed. Prior to this discussion, B-rep concepts involved in the method are now discussed, with reference to FIGS. 3-25.

Figure 3:
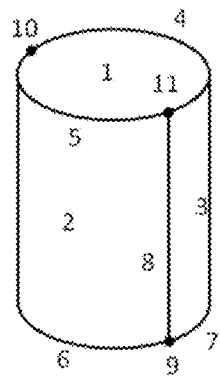
Figure 4:
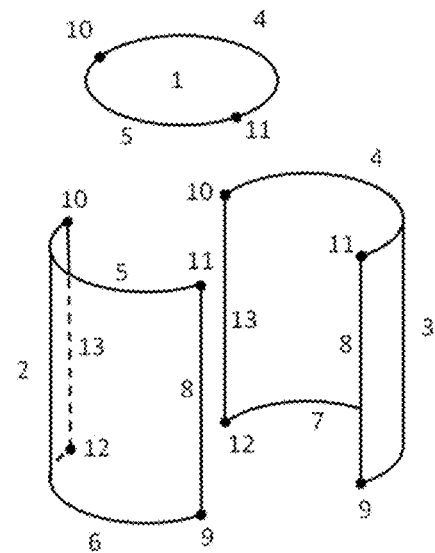
Figure 5:
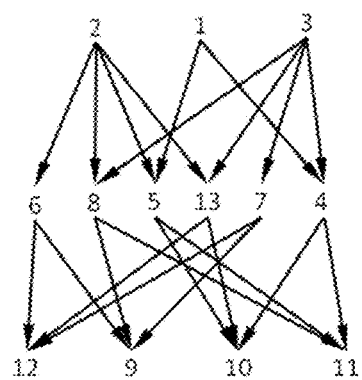

A B-Rep includes topological entities and geometrical entities. Topological entities are: face, edge, and vertex. Geometrical entities are 3D objects: surface, plane, curve, line, point. By definition, a face is a bounded portion of a surface, named the supporting surface. An edge is a bounded portion of a curve, named the supporting curve. A vertex is a point in 3D space. They are related to each other as follows. The bounded portion of a curve is defined by two points (the vertices) lying on the curve. The bounded portion of a surface is defined by its boundary, this boundary being a set of edges lying on the surface. Edges of the face's boundary are connected by sharing vertices. Faces are connected by sharing edges. Two faces are adjacent if they share an edge. Similarly, two edges are adjacent if they share a vertex. FIG. 3 illustrates a B-rep of a cylindrical slot made of three faces: top planar face and two lateral cylindrical faces. FIG. 3 shows the perspective view of the slot. Visible faces, edges and vertices are numbered. FIG. 4 shows the exploded view of all faces. Duplicated numbers illustrate edges and vertices sharing. Face 1 is a bounded portion of a plane. Boundary of face one includes edges 4 and 5, each of them being bounded by vertices 10 and 11. They both have the same supporting circle. Face 2 is bounded by edges 6, 8, 5 and 13 all lying on an infinite cylindrical surface. Faces 1 and 2 are adjacent because they share edge 5. Faces 2 and 3 are adjacent because they share edges 8 and 13. Faces 1 and 3 are adjacent because they share edge 4. FIG. 5 shows a graph illustrating the "is bounded by" topological relationship of the B-Rep of FIGS. 3 and 4. Nodes of higher layer are faces, nodes of intermediate layer are edges and nodes of lower layer are vertices. FIG. 6 shows a graph illustrating the relationship between topological entities (faces, edges, vertices) of the B-rep of FIG. 4. FIG. 7 shows the supporting geometries. In the CAD system, the B-Rep gathers in an appropriate data structure the "is bounded by" relationship, the relationship between topological entities and supporting geometries, and mathematical descriptions of supporting geometries.

By definition, an internal edge of a B-Rep is shared by exactly two faces. By definition, a boundary edge is not shared, it bounds only one face. By definition, a boundary face is bounded by at least one boundary edge. A B-Rep is said to be closed if all its edges are internal edges. A B-Rep is said to be open if it includes at least one boundary edge. The B-Rep of the example shown in FIGS. 3 and 4 is open because edges 6 and 7 are boundary edges. Conversely, edges 4, 5, 8 and 13 are internal edges. A closed B-Rep is obtained from the example of FIGS. 3 and 4 by adding disk-like face 14 bounded by edges 6 and 7 as illustrated in FIG. 8. FIG. 8 shows the closed B-rep, and FIG. 9 shows a graph illustrating the "is bounded by" topological relationship of the closed B-Rep. A closed B-Rep is used to model a thick 3D volume because it defines the inside portion of space (virtually) enclosing material. An open B-Rep is used to model a 3D skin, which represents a 3D object the thickness of which is sufficiently small to be ignored. In the case of the method, an open B-rep may notably model a 3D skin which represents a physical surface of a mechanical part.

Each face of the B-Rep is equipped with a normal vector, defined with the help of the supporting surface. Firstly, the normal vector is collinear with the normal vector of the supporting surface. In addition, the normal vector of a closed B-Rep representing a mechanical part is directed outside the material. Let F be a face of the B-Rep and N its outer normal vector. Let E be an edge of face F, X a point on edge E and T the normalized tangent vector of edge E at point X. By definition, edge E is oriented counterclockwise if vector M=N×T is directed toward the inside region of the face, in FIG. 10. Notice that since vectors N and T are normalized and perpendicular, then vector M is normalized. By convention, all edges of all faces of a B-Rep are oriented counterclockwise, as illustrated in FIG. 11.

Orienting an open B-rep, which may also referred to as an "open skin"), is ambiguous because the inside and the outside cannot be defined. Consequently, any open skin can be equipped with two orientations, as illustrated by FIGS. 12 and 13. FIG. 12 shows an open skin oriented with a first orientation, while FIG. 13 shows the same open skin oriented with a second orientation.

In case of an open B-rep, the orientation is arbitrary and chosen by the CAD system. It may not be meaningful to the user, notably because the user may not know whether the orientation is directed inside or outside the material. In other words, an open B-rep is arbitrarily oriented by the CAD system independently from the location of the inside or the outside of material, while a closed B-rep has a normal vector directed outside the material. For example, the user may not know whether a bump on a B-rep is directed inside the material, in which case the bump may be a depression, or outside the material, in which case the bump may be a protrusion. Specifically, the CAD system does not cause this ambiguity of the orientation as such. The CAD system computes the orientation based on the normal vectors defined on the B-rep. It may happen that the normal vectors, when edited, are not properly directed (e.g. with respect to the outside/inside of the material as it is in the real world). This occurs particularly often when editing an open B-rep, as the normal vectors may not be immediately useful at the beginning of the design. The CAD system may in other words compute the orientation based on wrong data, which yields this ambiguity of the orientation.

The notion of convexity of an edge of the B-rep of a 3D modeled object is now discussed, with reference to FIGS. 14 to 21. In this discussion, the B-rep may be closed or open. In any case, the B-rep has an orientation (defined by means of a normal vector as previously explained).

Figure 14:
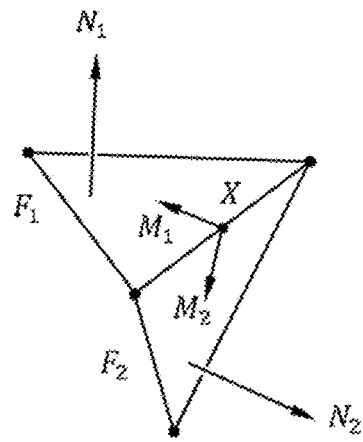
Figure 15:
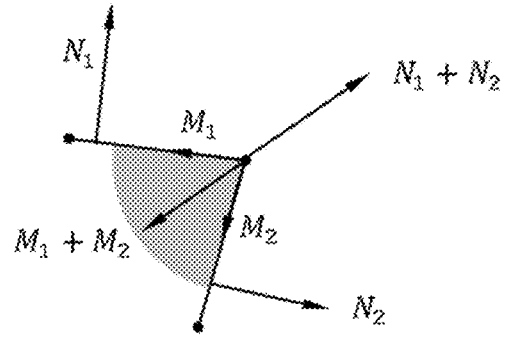
Figure 16:
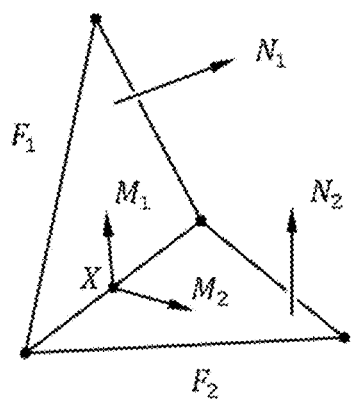
Figure 17:
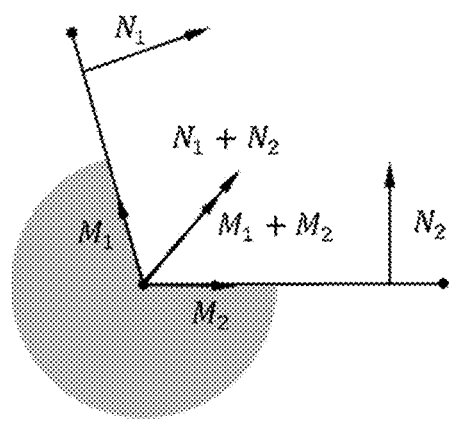

Given the B-Rep of the 3D modeled object, let E be an edge shared by faces $F_1$ and $F_2$, and let X be a point on edge E. Respective outer normal vectors of faces $F_1$ and $F_2$ are noted $N_1$ and $N_2$. Let $P_1$ and $P_2$ be the planes through point X with respective normal vectors $N_1$ and $N_2$. Planes $P_1$ and $P_2$ locally define an outside 3D region and an inside 3D region in the neighborhood of point X. By nature, vector $N_1+N_2$ points to the outside 3D region. Let $M_1$ and $M_2$ be the respective material vectors of point X with respect to faces $F_1$ and $F_2$. By nature, vector $M_1+M_2$ points to the convex 3D region. By definition, edge E is convex at point X if $N_1+N_2$ and $M_1+M_2$ have opposite directions, i.e. if $\langle M_1+M_2, N_1+N_2 \rangle <0$, as illustrated in FIGS. 14 and 15. Edge E is convex if it is convex at all points. Conversely, edge E is said to be concave at point X if $N_1+N_2$ and $M_1+M_2$ have the same direction, i.e. if $\langle M_1+M_2, N_1+N_2 \rangle >0$, as illustrated in FIGS. 16 and 17. Edge E is concave if it is concave at all points. Otherwise, $\langle M_1+M_2, N_1+N_2 \rangle =0$ meaning that the edge is either a smooth edge or a knife edge. A smooth edge is such that $M_1+M_2=0$ and $N_1=N_2$ as illustrated in FIGS. 18 and 19. It usually occurs in B-Rep of typical mechanical parts. A knife edge is such that $N_1+N_2=0$ and $M_1=M_2$ as illustrated in FIGS. 20 and 21. Knife edge is described for completeness, it is not usually used for modeling mechanical parts.

Clearly, the convexity of a sharp edge (convex vs. concave) is closely related to the normal vector orientation. When dealing with an open skin, this orientation is arbitrary, and this makes convexity less visually meaningful to the user than in the case of a closed B-rep. For example, in case of an open B-rep, a user may see that a sharp edge has a convexity (i.e. is concave or convex), but the user may however not know whether the convexity of the sharp edge is the same of that of a portion, corresponding to the sharp edge, of the mechanical part once manufactured in the real world.

Figure 22:
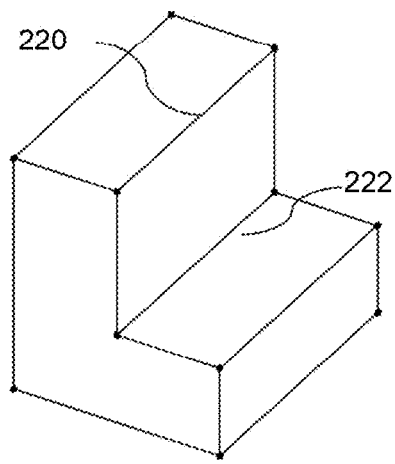
Figure 23:
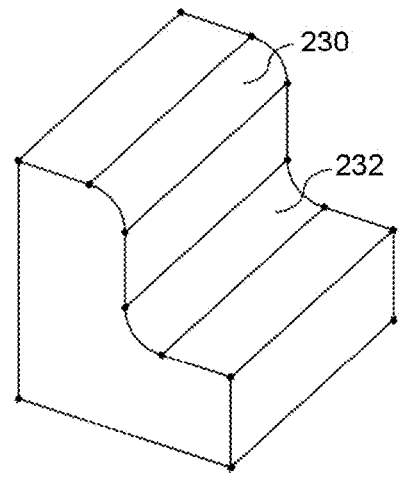
Figure 24:
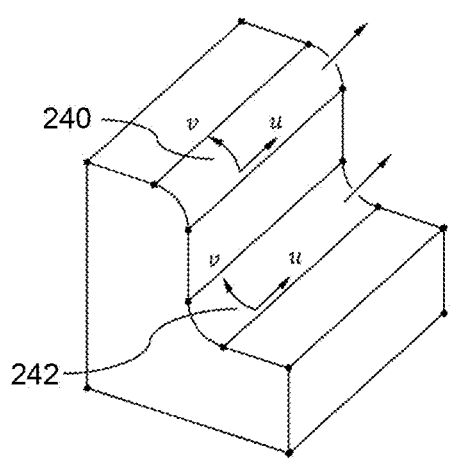

From the geometrical point of view, a round face replaces a convex sharp edge by a smooth transition. The transition face is the envelope of a rolling ball connecting the adjacent faces of the initial sharp edge. Similarly, a fillet face replaces a concave sharp edge by a smooth transition based on the same rolling ball geometry. FIGS. 22 and 23 illustrate the geometry of round and fillet faces. FIG. 22 shows a convex edge 220 and a concave edge 222. FIG. 23 shows the corresponding round face 230 and fillet face 232. Just like canonical surfaces (such as cylinder, plane, sphere, cone) round faces and fillet faces are generally equipped with a logical type in the B-Rep data structure. If this logical type is missing they can be recognized as follows. The parameterization $S:[a,b]\times[c,d]\to\mathbb{R}^3$ with $(u,v)\to S(u,v)$ is such that for all $u\in[a,b]$ the curve $v\to S(u,v)$ is a portion of a circle the radius of which does not depend on u. Or, for all $v\in[c,d]$ the curve $u\to S(u,v)$ is a portion of a circle the radius of which does not depend on v. If the outer normal vector of the B-rep is oriented toward the concave side of the circle, then the face supported by surface S is a round surface. If the outer normal vector of the B-rep is oriented toward the convex side of the circle, then the face supported by surface S is a fillet surface. FIG. 24 illustrates the parameterization of a round face 240 and of a fillet face 242. Round faces and fillet faces respectively behave like convex edges and concave edges. This is because, from the mechanical point of view, a round face is a smooth transition replacing a convex sharp edge, and a fillet face is a smooth transition replacing a concave sharp edge. This always occurs when designing mechanical parts manufactured through molding and machining methods.

Figure 25:
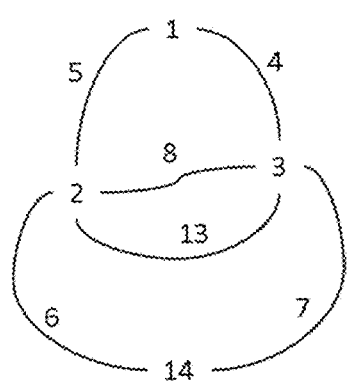

The following discusses the notion of dual graph of a B-rep. The dual graph of the B-Rep is a logical graph that captures faces adjacencies only. It is defined as follows. Nodes of the dual graph are associated with faces of the B-Rep and arcs of the dual graph are associated with edges of the B-Rep. An arc of the dual graph connects two nodes of the dual graph if the B-Rep edge associated with the arc is shared by the B-Rep faces respectively associated with nodes. For example, the dual graph of the cylindrical B-Rep of FIG. 8 is represented in FIG. 25. Arcs are labeled with edges numbers. A connected set of faces forms an arcwise connected part of the B-rep and may be defined as follows: the set of faces is connected if the nodes of the dual graph representing the faces of the set are the nodes of a connected subgraph of the dual graph.

Bumps, protrusion and depressions are now discussed.

The mechanical part may be designed to fulfill a mechanical function, which is performed by one or more bumps. A bump is a layout (e.g. an arrangement) of material that performs a mechanical function. A bump may be a depression, which is a layout of material having a shape of a depression. Alternatively, a bump may be a protrusion, which is a layout of material having a shape of a protrusion.

A bump has a geometry which may correspond to and/or represent and/or form the layout of material that is the bump. The geometry may comprise (e.g. involve, e.g. be a combination of) several basic geometries. A basic geometry may be a linear extrusion. A linear extrusion may be a pad (which adds material). A linear extrusion may be a pocket (which removes material). A basic geometry may be a revolute. A revolute may be a shaft (which adds material). A revolute may be a groove (which removes material). A basic geometry may be a swept profile. A swept profile may be a rib (which adds material) and/or a stiffener (which adds material). A revolute may be a slot (which removes material).

A bump may be represented by a connected set of faces. In other words, the part of the B-rep corresponding to the connected set of faces may model and/or represents the geometry of the bump. When the connected set of faces has a generally concave shape and when the boundary of the set of faces is full convex, the bump may be referred to as a depression. When the connected set of faces has a generally convex shape and when the boundary of the set of faces is full concave, the bump may be referred to as a protrusion. Thus, when the normal vector of the B-rep is meaningful to the user, which is in the case of a closed B-rep as previously discussed, the concepts of protrusion and depression may be defined without ambiguity. When dealing with an open skin, a bump may be a protrusion or a depression, depending on the normal vector orientation. A bump that is a depression according to a given normal vector orientation becomes a protrusion according to the opposite normal vector orientation, and vice versa.

Figure 26:
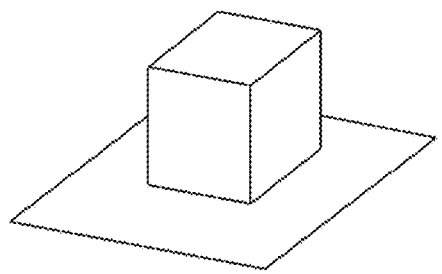
Figure 27:
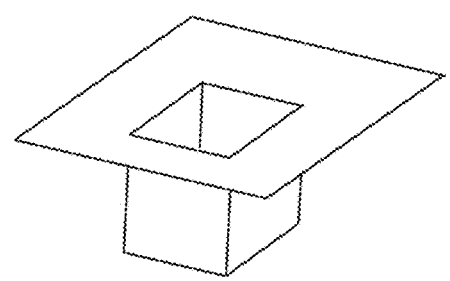

FIGS. 26 and 27 illustrate the visual ambiguity between a protrusion and a depression in case of an open B-rep. By "visual ambiguity", it is meant that, when displaying an open skin, the same geometry can be interpreted by the user as a depression or as a protrusion depending on the viewpoint. This misunderstanding is impossible with solids (represented by closed B-reps) because the viewpoint is always outside material. FIGS. 26 and 27 illustrate the phenomenon. FIG. 26 illustrates an open skin featuring what looks like a protrusion. FIG. 27 illustrates an open skin featuring what looks like a depression. Yet both drawings are the same open skin but seen from different viewpoints.

The displaying of the B-rep may result from an action of a user, e.g. an interaction between the user and the CAD system of the method. In examples, the 3D modeled object (e.g. partly) represented by the B-rep may have been designed by a another user on another CAD system and optionally stored in a memory and/or sent (e.g. through a network) to the CAD system of the method. The displaying of the B-rep may then comprise retrieving the B-rep from the memory. Alternatively or additionally the user may design the 3D modeled object from scratch or at least partially. The B-rep may be displayed on any display of the CAD system such as a graphical user interface, such as the one described with reference to FIG. 1.

The B-rep may be an open B-rep or a closed B-rep. In examples, the B-rep is an open B-rep. The B-rep represents at least a part of the mechanical part. By this it is meant that the B-rep represents the whole mechanical part or only a strict portion of the mechanical part.

In examples, the open B-rep may notably correspond to a physical surface of the mechanical part. By this it is meant that the B-rep may represent the geometry of the physical surface or a geometry based on which the geometry of the physical surface may be deduced. For example, the B-rep may represent the geometry of a mid-surface. The mid-surface is a surface from which a top surface and a bottom surface may be deduced respectively by two offsets, one in the direction of a normal vector of the mid-surface, and the other in the opposite direction of the normal vector.

The physical surface may be an outer portion of the mechanical part, such as a top surface or a bottom surface. In such a case, the B-rep may represent the geometry of the outer portion or the geometry of a mid-surface from which the geometry of the outer portion may be deduced.

Additionally or alternatively, the physical surface may be an interface between an outer portion of the mechanical part shaped by an outer portion of a manufacturing tool and the outer portion of the manufacturing tool shaping the outer portion of the mechanical part. In such a case, the B-rep may represent the geometry of the outer portion of the mechanical part. Alternatively, the B-rep may represent the geometry of the outer portion of the manufacturing tool. Alternatively, the B-rep may represent the geometry of a mid-surface from which the geometry of the outer portion of the mechanical part and/or the geometry of the outer portion of the manufacturing tool may be deduced.

Additionally or alternatively, when the mechanical part is a molded part (e.g. a plastic thin part), the physical surface may represent an interface between a mold manufacturing the molded part and an outer portion of the molded part shaped by the mold.

Additionally or alternatively, when the mechanical part is a turned part (e.g. a thin part), the physical surface may represent the part or at least a portion of the part.

Additionally or alternatively, when the mechanical part is a stamped part (e.g. a thin aluminum stamped part, a car door or a piece of a car body), the physical surface may represent the part or at least a part of it.

The displayed B-rep comprises one or more bumps, one of which being the bump recognized by the method. These bumps are now discussed.

In the context of the method, a bump may be any one or any combination of a mass reduction feature (i.e. performing a mass reduction function), a space reservation feature (i.e. performing a space reservation function), a fixture feature (i.e. performing a fixture function), a tightness feature (i.e. performing a tightness function), an adjustment feature (i.e. performing an adjustment function), a positioning feature (i.e. performing a positioning function), a mechanical joint feature (i.e. performing a mechanical joint function), a cooling feature (i.e. performing a cooling function), a revolute or cylindrical mechanical joint feature (i.e. performing a revolute or cylindrical mechanical joint function), an assembly feature (i.e. performing an assembly function), a stiffening feature (i.e. performing a stiffening function) and/or a support for all machined and drilled protrusion feature (i.e. performing a support for all machined and drilled protrusion function).

Examples of functions performed by examples of bumps which are depressions are now discussed.

In examples, the mechanical part is manufactured by a molding manufacturing process. In these examples, any bump of the B-rep that is a depression may be a mass reduction feature (i.e. performing a mass reduction function) and/or a space reservation feature (i.e. performing a space reservation function).

Additionally or alternatively, the mechanical part may be manufactured by a machining manufacturing process. In these examples, any bump of the B-rep that is a depression may be a mass reduction feature (i.e. performing a mass reduction function), a fixture feature (i.e. performing a fixture function), a tightness feature (i.e. performing a tightness function), an adjustment feature (i.e. performing an adjustment function), a positioning feature (i.e. performing a positioning function), a mechanical joint feature (i.e. performing a mechanical joint function), a cooling feature (i.e. performing a cooling function) and/or a space reservation feature (i.e. performing a space reservation function).

Additionally or alternatively, the mechanical part may be manufactured by a drilling manufacturing process. In these examples, any bump of the B-rep that is a depression may be a fixture feature (i.e. performing a fixture function), a positioning feature (i.e. performing a positioning function), a revolute or cylindrical mechanical joint feature (i.e. performing a revolute or cylindrical mechanical joint function), a cooling feature (i.e. performing a cooling function) and/or a space reservation feature (i.e. performing a space reservation function).

Additionally or alternatively, the mechanical part may be manufactured by a turning manufacturing process. In these examples, any bump of the B-rep that is a depression may be a revolute or cylindrical mechanical joint feature (i.e. performing a revolute or cylindrical mechanical joint function).

Additionally or alternatively, the mechanical part may be manufactured by a forging manufacturing process. In these examples, any bump of the B-rep that is a depression may be a mass reduction feature (i.e. performing a mass reduction function).

Additionally or alternatively, the mechanical part may be manufactured by a stamping manufacturing process. In these examples, any bump of the B-rep that is a depression may be an assembly feature (i.e. performing an assembly function), a stiffening feature (i.e. performing a stiffening function) and/or a space reservation feature (i.e. performing a space reservation function).

Additionally or alternatively, the mechanical part may be manufactured by a folding manufacturing process. In these examples, any bump of the B-rep that is a depression may be an assembly feature (i.e. performing an assembly function), a stiffening feature (i.e. performing a stiffening function) and/or a space reservation feature (i.e. performing a space reservation function).

Examples of functions performed by examples of bumps which are protrusions are now discussed.

In examples, the mechanical part is manufactured by a molding manufacturing process. In these examples, any bump of the B-rep that is a protrusion may be a stiffening feature (i.e. performing a stiffening function).

Additionally or alternatively, the mechanical part may be manufactured by a machining manufacturing process. In these examples, any bump of the B-rep that is a protrusion may be a fixture feature (i.e. performing a fixture function) and/or a positioning pin feature (i.e. performing a positioning pin function).

Additionally or alternatively, the mechanical part may be manufactured by a turning manufacturing process. In these examples, any bump of the B-rep that is a protrusion may be a revolute or cylindrical mechanical joint feature (i.e. performing a revolute or cylindrical mechanical joint function) and/or a positioning pin feature (i.e. performing a positioning pin function).

Additionally or alternatively, the mechanical part may be manufactured by a forging manufacturing process. In these examples, any bump of the B-rep that is a protrusion may be a stiffening feature (i.e. performing a stiffening function) and/or a support for all machined and drilled protrusion feature (i.e. performing a support for all machined and drilled protrusion function).

Additionally or alternatively, the mechanical part may be manufactured by a stamping manufacturing process. In these examples, any bump of the B-rep that is a protrusion may be an assembly feature (i.e. performing an assembly function), a stiffening feature (i.e. performing a stiffening function) and/or a space reservation feature (i.e. performing a space reservation function).

Additionally or alternatively, the mechanical part may be manufactured by a folding manufacturing process. In these examples, any bump of the B-rep that is a protrusion may be an assembly feature (i.e. performing an assembly function), a stiffening feature (i.e. performing a stiffening function) and/or a space reservation feature (i.e. performing a space reservation function).

Figure 28:
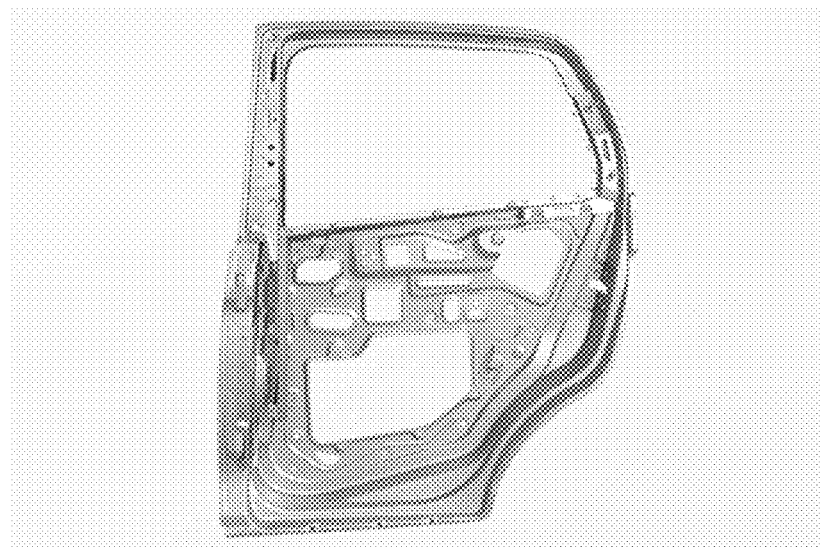
Figure 29:
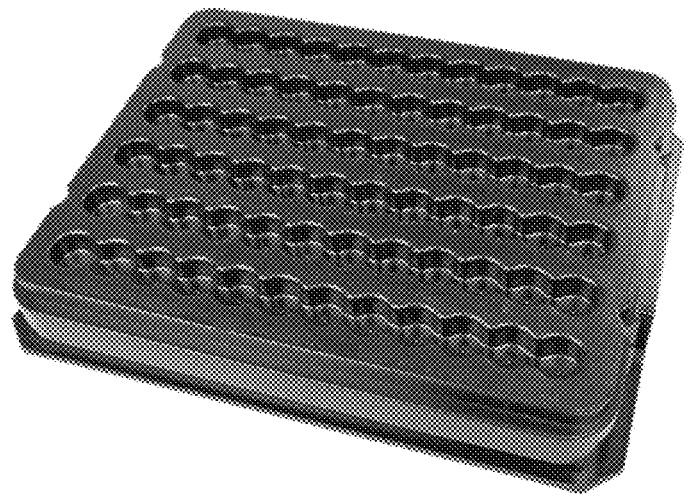

Examples of geometries of bumps on examples of mechanical parts are now discussed with reference to FIGS. 28 and 29. FIG. 28 shows a stamped part which is car door and FIG. 29 shows a molded part which is a thin plastic part. The examples of parts of FIG. 28 and FIG. 29 may notably be represented by open B-reps.

Other examples of parts may, at some point of their design, have a sub-part which is constructed as a surface. In these examples, at some other point of the design process (e.g. at the end), the part may however by represented as a volume by a closed B-rep. The method also handles volumes, i.e. B-reps which are closed.

The selecting of the at least one face of the B-rep is now discussed.

The selecting is carried out by graphical user interaction. In other words, a user graphically interacts with a display (e.g. a graphical user interface such as the one illustrated on FIG. 1) in order to select the at least one face. For example, the user may select the at least one face by clicking on the at least one face, e.g. by clicking on a visible part of the at least one face. Alternatively, the user may select the at least one face by touching the at least one face, e.g. by touching a visible part of the at least one face. These manners of selecting the at least one face are particularly simple and ergonomic. Notably in examples where the at least one face consists in only one face, the user only needs to touch the one face or to click on it to select it.

The at least one face is a face of the set of faces representing the bump and that is recognized by the method. In examples, the at least one face consists in one face of the B-rep, i.e. a single face of the B-rep. The one face may for example be a face of the bump which is at least partially visible to the user, for example a face which is not entirely hidden by another face of the B-rep. The one face may for example be one of the most visible faces of the bump. Alternatively or additionally, the one face may be a top face of the bump or a lateral face of the bump. In examples, if the bump as displayed by the method has a protruded shape, the one face may be the top face of the bump or a lateral face of the bump. This may be the case for example if the bump as displayed has a cuboid shape. In other examples, if the bump as displayed by the method has a depressed shape, the one face may be a lateral face of the bump, such as an inside face of a hole. This may be the case for example if the bump as displayed has a shape of a hole, such as a through hole or a non through hole.

Selecting only one face of the B-rep that belongs to the bump is a particularly simple and ergonomic manner of selecting a part of the bump based on which the CAD system then automatically recognizes the bump. This makes the method user-friendly and ergonomic. This is notably the case when the one face is a face which is (e.g. the most) visible for the user. This improves simplicity and ergonomics when selecting the at least one face.

In examples, the selected at least one face may consist in several faces, e.g. each face of the at least one face belonging to a respective bump. In such cases, the recognizing may be iterated for each face of the at least one face. In other words, for each face of the at least one face, a respective set of faces comprising the face and representing the respective bump to which the face belongs is recognized by a respective iteration of the recognizing.

The recognizing of the set of faces representing the bump is now discussed.

The set of faces representing the bump comprises the at least one face and is recognized automatically by the CAD system. In other words, upon the user selecting graphically a (e.g. small and visible) part of the bump (i.e. the at least one face), the computer automatically recognizes all faces representing the bump, e.g. including the ones hidden to the user, if any. This makes the method efficient and ergonomic.

The recognizing of the set of faces includes the determining of the first set of faces and the second set of faces. This is now discussed.

The first set of faces comprises the at least one face and represents a depression. In other words the determining takes as input the at least one face. The determining then determines the first set of faces. This may be carried out by any process or algorithm configured to take as input the at least one face and to output a set of faces that comprises the at least one face and that represents a depression. Such an algorithm may notably comprise iteratively visiting neighboring faces of the at least one face and collecting or not these neighboring faces based on their convexity and/or on the convexity of the edges shared by them. The collected faces are such that, together with the at least one face, they form a set of faces which has the convexity of a depression. The determining also determines the second set of faces. This may be carried out by any process or algorithm configured to take as input the at least one face and to output a set of faces that comprises the at least one face and that represents a protrusion. Such an algorithm may notably comprise iteratively visiting neighboring faces of the at least one face and collecting or not these neighboring faces based on their convexity and/or on the convexity of the edges shared by them. The collected faces are such that, together with the at least one face, they form a set of faces which has the convexity of a protrusion. In any case, the determining outputs the first set of faces and the second set of faces.

It is to be understood that the B-rep has an orientation, whether the B-rep is closed or open. With respect to this orientation, which as previously said can be arbitrary and not visually meaningful to the user, the determining determines two sets of faces comprising the at least one face, one representing a protrusion and one representing a depression. One of these sets of faces is the set of faces representing the bump, which is a depression or a protrusion. Thus, whether the bump is a protrusion or a depression, at least one of the determined sets of faces represents the bump. This set will be then selected among the two determined sets, as discussed hereinafter. In other words, determining both the first set and the second set ensures that the bump will be recognized without any knowledge of whether the bump is a depression or a protrusion. This makes the method efficient.

The method is notably particularly efficient in examples where the B-rep is open, the arbitrary orientation of such a B-rep making the concepts of protrusion and depression ambiguous, as previously discussed. Indeed, the method circumvent this ambiguity by searching for both a protrusion and a depression, one of which being then selected by the selecting as explained hereinafter. In other words there is no need that the user knows whether the bump is a protrusion or a depression for the method to recognize the bump.

In examples, the first set of faces comprises a first connected set of one or more faces containing no convex internal edge and no round face. In these examples, the second set of faces comprises a second connected set of one or more faces containing no concave internal edge and no filet face.

The first set of faces thus comprises the first connected set of one or more faces, which, by containing no convex internal edge and no round face, has the convexity of a depression. Similarly, the second set of faces comprises the second connected set of one or more faces, which, by containing no concave internal edge and no fillet face, has the convexity of a protrusion.

Thus, upon selection of the at least one face, the method automatically determines two sets of faces comprising it, one having substantially the shape of a protrusion (i.e. the first set of faces), and one having substantially the shape of a depression.

In examples, the first connected set of one or more faces is bounded by convex edges and/or round faces only. In these examples, the second connected set of one or more faces is bounded by concave edges and/or filet faces only.

The determining of the first (resp. second) set of faces may notably iteratively visit neighboring faces of the at least one face and collect neighboring faces which either are not a round (resp. fillet) face or do not share convex (resp. concave) edges with other collected neighboring faces. These collected faces may notably form, together with the at least one face, the first (resp. second) connected set of one or more faces. The requirement that the first (resp. second) connected set of one or more faces be bounded by convex (resp. concave) edges and/or round (resp. fillet) faces only may be a stopping criterion of the iterative visiting and collecting. This way faces which are not needed to represent the convexity of a depression (resp. protrusion) are not collected or not even visited. This improves efficiency and robustness of the method.

In examples, the first set of faces consists in the first connected set of one or more faces. In these examples, the second set of faces consists in the second connected set of one or more faces.

In these examples, the method thus determines, with respect to an orientation of the B-rep, a depression corresponding to a connected set of faces containing no convex internal edge and no round face and bounded by convex edges and/or round faces only and a protrusion corresponding to a connected set of faces containing no concave internal edge and no fillet face and bounded by concave edges and/or fillet faces only. Searching for a depression corresponding to a connected set of faces containing no convex internal edge and no round face and bounded by convex edges and/or round faces only and a protrusion corresponding to a connected set of faces containing no concave internal edge and no fillet face and bounded by concave edges and/or fillet faces only is an efficient and simple way to extend the at least one face into a minimal depression (e.g. a depression with minimal boundary) or into a minimal protrusion (e.g. a protrusion with minimal boundary) representing it. In other words, as one among the determined protrusion and the determined depression is the bump to be recognized, searching for such depressions and such protrusions is an efficient and simple way to extend the at least one face into a minimal bump (e.g. a bump having a minimal boundary) comprising it. In these examples, the method thus fulfills efficiently a user requirement which is, upon a simple selection of the at least one face, automatically extending it into a minimal bump comprising it.

In any case, the determining has two outputs, which are the first set of faces and the second set of faces. The first set of faces represents a depression while the second set of faces represents a protrusion. One set among the first set of faces and the second set of faces represents the bump. The method automatically determines which one by selecting, among the first set of faces and the second set of face, a set of faces having a shortest boundary curve perimeter and being different from both the selected at least one face and the B-rep.

This is now discussed.

By "selecting, among the first set of faces and the second set of face, a set of faces", it is meant that the selecting takes as input the first set of faces and the second set of faces and outputs the one set of faces that has the shortest boundary curve perimeter. The outputted set of faces is the set of faces representing the bump. In other words, and as previously said, determining a first set of faces representing a protrusion and a second set of faces representing a depression, regardless of any knowledge of whether the bump is a protrusion or a depression, ensures that at least one of the two determined sets represents the bump. Then the selecting automatically selects the one set that represents the bump. This recognizing in two steps is robust and efficient.

The selecting selects, among the first set of faces and the second set of faces, the set of faces having a shortest boundary curve perimeter and being different from both the selected at least one face and the B-rep. Now, when selecting the at least one face, the user expects a set of faces comprising the at least one face to be recognized. The set of faces is to represent the bump. Thus, the set of faces should not include too many faces, but only the faces representing the bump. Selecting, among the first set of faces and the second set of faces, the one having the shortest boundary curve perimeter, allows recognition of the one that does not include too many faces and that truly represents the bump. This is an efficient manner of selecting, among the two determined sets of faces, the one that truly represents the bump. One may in fact speak of "recognition of a minimal bump comprising the at least one face" or as "extending the at least one face to a minimal bump comprising it".

In examples, the selecting may comprise assessing, among the first set of faces and the second set of faces, the one set which has the shortest boundary curve perimeter. The assessing may include computing the boundary curve perimeter of the first set of faces, computing the boundary curve perimeter of the second set of faces, and comparing the computed boundary curve perimeter of the first set of faces and the computed boundary curve perimeter of the second set of faces. The computing may be followed by outputting the one set of faces which has the smallest boundary curve perimeter.

The assessing may be preceded by verifying that the first set of faces and the second set of faces are different from the B-rep and comprise a face that is different from the selected at least one face. If one of the sets equals the B-rep or equals the at least one face, then this set does not represent the bump and the other one is selected. In such a case, the boundary curve perimeter of the two sets of faces is not computed, because the set truly representing the bump is already recognized.

Indeed, the set of faces representing the bump should include at least another face in addition of the selected at least one face, because in most examples the at least one face alone, especially when the at least one face consists in one face, does not represent the whole bump. The at least one face is only a part of the bump that the user can easily select for the whole bump to be then recognized. In other words, the user sees the bump, selects only a part of it, and expects the whole bump to be recognized. Thus, the recognized set of faces should include at least another face in addition of the selected at least one face, because it is a functionality wanted by the user when he/she selects the at least one face.

Moreover, the set of faces representing the bump should be different from the whole B-rep, because in most examples the bump is only a part of the B-rep performing a specific mechanical function. Furthermore, the functionality wanted by the user is to recognize automatically a bump which is only a part of the B-rep upon the selection of only a part of the bump.

The verifying thus improves efficiency and robustness of the selecting, because it allows to discard in a very simple manner, and without computing any boundary curve perimeter, the set of faces that does not represent the B-rep and that is not the one that the user expected to be recognized when he/she selected the at least one face.

The boundary curve perimeter of a set of faces may be any quantity representing a size of the boundary curve of the set of faces. The boundary curve may be defined as the set of boundary edges of the set of faces, i.e. the set of edges which each have a single boundary face among the set of faces. For example, it may be any length of the boundary curve. In examples, the length of the boundary curve is the sum of the curvilinear length of each edge of the boundary. The boundary curve perimeter of a set of faces may be computed by any known method for computing the perimeter of a boundary curve of a set of faces.

In examples, a set of faces has a shortest boundary curve relatively to another set of faces if:
  the boundary curve perimeter of the set of faces is strictly smaller than the boundary curve perimeter of the another set of faces; or
  the boundary curve perimeter of the set of faces equals the boundary curve perimeter of the another set of faces, and a length of a bounding box of the set of faces is smaller than a length of a bounding box of the another set of faces.

The bounding box may be any bounding box, e.g. of any shape. The bounding box may be any volume, such as the shape of a cuboid, of a rectangle, of a parallelepiped, of a sphere or of an ellipsoid. The length of the bounding box may be any length, such as the length of the longest segment included in the volume (e.g. diameter of a sphere or diagonal of a rectangle).

It has been explained how the selecting of a set of faces may comprise assessing which one, among the first set of faces and second set of faces, has the shortest boundary curve perimeter. The assessing may further comprise, if the boundary curve perimeter of the first set of faces equals the boundary curve perimeter of the second set of faces, assessing which one, among the length of the bounding box of first set of faces and the length of the bounding box of the second set of faces, is the smallest. This may include computing and comparing the length of the bounding box of first set of faces and the length of the bounding box of the second set of faces, and then outputting the one set of faces of which bounding box has the smallest length.

The method is thus able to handle situations where the first set of faces and the second set of face have the same value of boundary curve perimeter. The method is thus efficient.

Examples of the selecting of the set of faces are now discussed.

In these examples, the selecting comprises determining whether either the first set of faces or the second set of faces is the at least one face and determining whether either the first set of faces or the second set of faces is the B-rep. If either the first set of faces or the second set of faces is the at least one face, or if either the first set of faces or the second set of faces is the B-rep, the selecting may then comprise outputting the one set of faces that is neither the at least one face nor the B-rep. The selecting may then end after the outputting, in which case the outputted set of faces is the set of faces expected by the user and representing the bump. This allows to efficiently select the set of faces representing the bump and that the user expects to be recognized (for reasons previously explained), as no boundary curve perimeter need in such cases being computed.

Then, in these examples, if neither the first set of faces nor the second set of faces is the B-rep, and if neither the first set of faces nor the second set of faces is the at least one face, the selecting comprises:
  determining whether the boundary curve perimeter of the first set of faces equals the boundary curve perimeter of the second set of faces; and
  if the boundary curve perimeter of the first set of faces equals the boundary curve perimeter of the second set of faces, comparing a length of a bounding box of the first set of faces and a length of a bounding box of the second set of faces.

This allows the selecting to output, in case neither the first set of faces nor the second set of faces is the B-rep or the at least one face, the one set of faces having the shortest boundary curve perimeter, which is thus the one that represents the bump and that meets the user's expectations.

In other words, the above-discussed examples improve efficiency and robustness of the method because they perform an ordered sequence of tests that discards, where appropriate, a set of faces that does not represents the bump and that the user does not expect to be recognized (for reasons previously explained), without any useless boundary curve perimeter computation.

Other examples of the selecting are now discussed.

In these examples, the selecting of the set of faces comprises determining whether either the first set of faces or the second set of faces is the at least one face. If either the first set of faces or the second set of faces is the at least one face, the selecting may then comprise outputting the one of the two sets of faces that is not the at least one face. The selecting may then end after the outputting, in which case the outputted set of faces is the set of faces representing the bump.

Then, in these examples, if neither the first set of faces nor the second set of faces is the at least one face, the selecting of the set of faces comprises determining whether either the first set of faces or the second set of faces is the B-rep. If either the first set of faces or the second set of faces is the B-rep, the selecting may then comprise outputting the one of the two sets of faces that does not equal the B-rep. The selecting may then end after the outputting, in which case the outputted set of faces is the set of faces representing the bump.

Then, in these examples, if neither the first set of faces nor the second set of faces is the B-rep, the selecting of the set of faces comprises determining whether the boundary curve perimeter of the first set of faces equals the boundary curve perimeter of the second set of faces. Then, if the boundary curve perimeter of the first set of faces is equal to the boundary curve perimeter of the second set of faces, the selecting comprises comparing a length of a bounding box of the first set of faces and a length of a bounding box of the second set of faces. The selecting may then output the set of faces which has the smallest bounding box length. Alternatively, if the boundary curve perimeter of the first set of faces is not equal to the boundary curve perimeter of the second set of faces, the selecting may output the set of faces which has, strictly, the smallest boundary curve perimeter.

These examples further improve efficiency of the method by further hierarchizing the previously discussed ordered sequence of tests. Notably, the set of faces truly expected by the user and representing the bump is automatically recognized as soon as the method determines that one of the determined sets of faces is the at least one face or as soon as the method determines that one of the determined sets of faces is the B-rep. In such situations, the ordered sequence of tests is thus shortened.

In examples, the recognized set of faces may be processed. Processing the recognized set of faces may comprise one or more of the following actions:
  extracting the recognized set of faces from the B-rep and/or displaying it, e.g. in a separated window of a display of the CAD system and/or highlighting it within a display of the B-rep;
  applying (e.g. by the user graphically interacting with the CAD system) one or more design and/or edition operation (e.g., change dimensions, change size, translate, change thickness, rotate, cut, copy, copy and/or paste) automatically and in a unified way to all faces of the recognized set of faces; and/or
  applying (e.g. by the user graphically interacting with the CAD system) one or more design and/or edition operation (e.g. translate, change size, change dimensions, round, fillet, draft angle and/or change thickness) automatically and in a unified way to all edges of one type (e.g. the sharp type, the smooth type, the knife type, the convex type or the concave type) bounding faces recognized set of faces.

Applying an operation automatically and in a unified way to a set of faces and/or edges consists in: specifying (e.g. selecting, e.g. upon user action) the set and the operation, launching (e.g. by interacting with the CAD system, e.g. upon user action) the operation, and, automatically (e.g. by the CAD system), applying the operation to all objects of the set (e.g. substantially) identically and/or (e.g. substantially) simultaneously.

Figure 30:
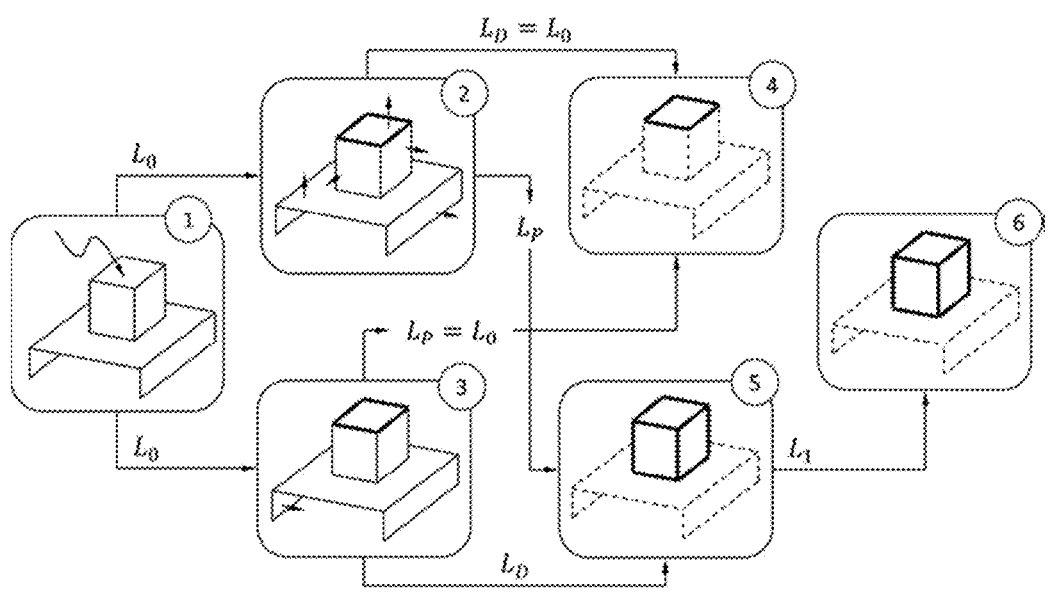
Figure 31:
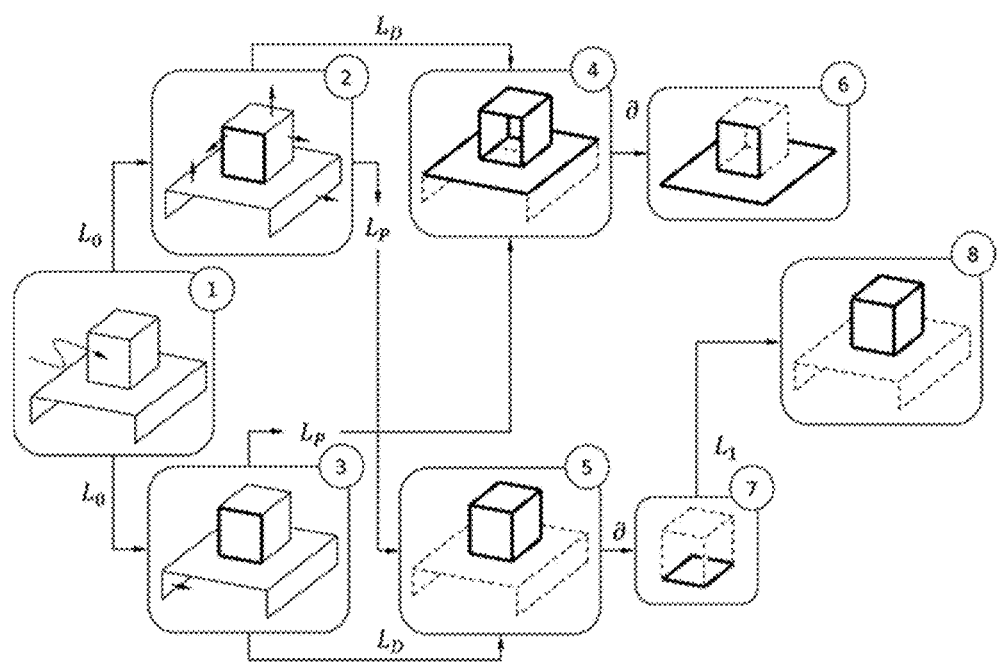
Figure 32:
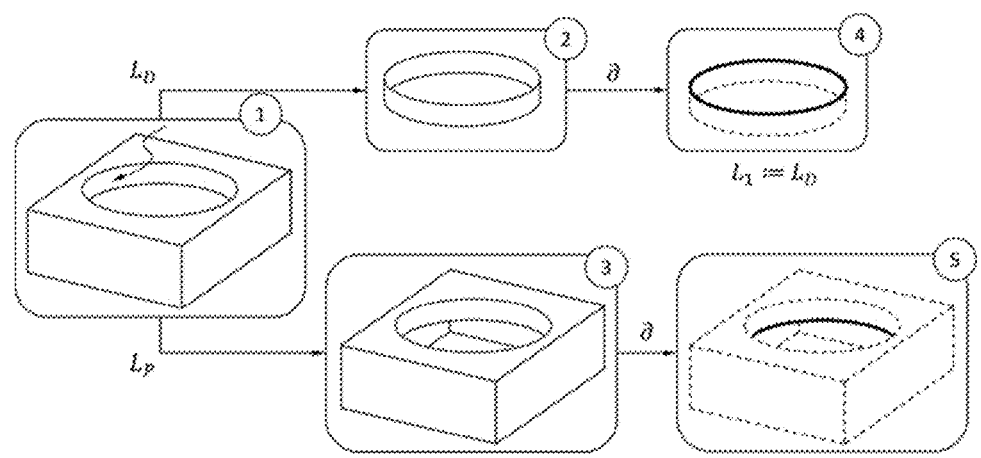

An implementation of the method is now discussed, with reference to FIGS. 30-32.

This implementation executes the method in four steps. The first steps carries out the selecting of the at least one face and the second, third and fourth steps carry out the recognizing of the set of faces representing the bump.

This implementation comprises a first step of user selection of at least one face. The at least one face is noted $L_0$ and consists in this implementation in a single face that belongs to the bump to be identified/recognized.

The second step of this implementation determines the first set of faces, by running a function Depression(•) in order to identify a depression according to the current orientation of the B-rep. The function Depression(•) takes as input the single face $L_0$ and outputs the first set of faces $L_D$, e.g. as a list of faces.

The method Depression(f) is to iteratively visit adjacent faces of initial face f until a convex edge or a round face is reached. This propagation algorithm makes use of a last-in-first-out (LIFO) list noted H and an output list noted E. The LIFO list is an internal data structure for propagation purpose. It is used through standard instruction Push(•), Pop(•) and Size. Instruction Push(x) adds object x on top of the list and increments its size. Instruction Pop(x) yields the last object of the list, noted x, removes it from the list and decrements its size. The output list E includes a the a set of faces initiated with input face f. Function Depression is described by the pseudo-code below.

```
Depression(f)
    E:=E ∪ {f}
    Set face f visited
    Push(f)
    While Size(H) > 0 do begin
        Pop(x)
        For each unvisited boundary edge b of face x do begin
            Set edge b visited
            If edge b is concave then
                y:= the adjacent face of face x sharing edge b
                If face y is unvisited then
                    Push(y)
                    E:=E ∪ {y}
                    Set face y visited
                End if
            Else if edge b is smooth then
                y:= the adjacent face of face x sharing edge b
                If face y is not a round face and is unvisited then
                    Push(y)
                    E:=E ∪ {y}
                    Set face y visited
                End if
            End if
        End for
    End while
    Return list E
```

The third step of this implementation determines the second set of faces, by running a function Protrusion(•) in order to identify a depression according to the current orientation of the B-rep. The function Protrusion(•) takes as input the single face $L_0$ and outputs the second set of faces $L_P$, e.g. as a list of faces.

The function Protrusion(f) is to iteratively visit adjacent faces of initial face f until a concave edge or a fillet face is reached. This propagation algorithm makes use of a last-in-first-out (LIFO) list noted H and an output list noted E. The LIFO list is an internal data structure for propagation purpose. It is used through standard instruction Push(•), Pop(•) and Size. Instruction Push(x) adds object x on top of the list and increments its size. Instruction Pop(x) yields the last object of the list, noted x, removes it from the list and decrements its size. The output list E includes faces a set of faces initiated with input face f. Function Protrusion is described by the pseudo-code below.

```
Protrusion(f)
    E:=E ∪ {f}
    Set face f visited
    Push(f)
    While Size(H) > 0 do begin
        Pop(x)
        For each unvisited boundary edge b of face x do begin
            Set edge b visited
            If edge b is convex then
                y:= the adjacent face of face x sharing edge b
                If face y is unvisited then
                    Push(y)
                    E:=E ∪ {y}
                    Set face y visited
                End if
            Else if edge b is smooth then
                y:= the adjacent face of face x sharing edge b
                If face y is not a fillet face and is unvisited then
                    Push(y)
                    E:=E ∪ {y}
                    Set face y visited
                End if
            End if
        End for
    End while
    Return list E
```

It is to be understood that the second step may be performed before or after the third step. Alternatively, the third and second steps may be performed jointly.

The fourth and last step of this implementation selects the set of faces representing the bump among the determined sets $L_D$ or $L_P$. The last steps carries out a sequence of logical tests in order to choose which output list $L_D$ or $L_P$ is appropriate, i.e. represents the bump. The output list of faces is noted $L_1$. Noting (L) the boundary curve of a list L of faces, noting (C) the length of a curve C, and noting Size(L) the length of the bounding box of a list L of faces the testing is as follows. Lines are numbered from 01 to 09.

```
01    If L_0 = L_D then L_1 := L_P
02    Else If L_0 = L_P then L_1 := L_D
03    Else If ∂L_P = ∅ then L_1 := L_D
04    Else If ∂L_D = ∅ then L_1 := L_P
05    Else
06        If l(∂L_P) = l(∂L_D) then
07            L_1 := argmin Si(L)
                    L∈{L_D,L_P}
08        Else
09            L_1 := argmin l(∂L)
                    L∈{L_D,L_P}
10        End if
11    End if
```

Notation $$y := \underset{x \in X}{\mathrm{argmin}} \; (x)$$

is a short cut for: find x∈X such that (x) is minimum and set x to variable y. Lines 01 to 08 deal with particular situations. The generic case is managed by instruction 09. The choice for the shortest boundary curve is motivated by the fact that the most relevant bump features a small interface with the remaining part of the skin.

FIG. 30 illustrates lines 01 and 02. The designer selects the top face of the shape, as illustrates in drawing 1. The shape appears to be displayed as a protruded shape, and the top face is a face particularly visible to the user and easy for him/her to select. Drawings 2 and 3 illustrate the two possible orientations of the input skin. Drawings 4 and 5 illustrate lists $L_P$ and $L_D$ as they are computed by the propagation algorithm, depending on the input skin orientation. Drawing 6 illustrates the resulting list of faces $L_1$ computed by this implementation. This implementation yields the appropriate result thanks to the following principle. Clearly, there are two possible results, as illustrated by drawings 4 and 5. Drawing 4 is precisely the face selected by the designer while drawing 5 is a larger list of faces including the user selected face together with lateral faces. The principle is that if the user goes through the bump detection functionality, it is for recognition purpose and not to get the single selected face. So, this implementation discards resulting list of drawing 4 because it is equal to the user's selection and provides the list of drawing 5.

FIG. 31 illustrates line 09 of the algorithm. The designer selects a lateral face of the input skin, as illustrated by drawing 1. The input skin appears to be displayed as a protruded shape, and the lateral face is a face particularly visible to the user and easy for him/her to select. Drawings 2 and 3 illustrate the two possible orientations of the input skin. Drawings 4 and 5 illustrate lists $L_P$ and $L_D$ as they are computed by the propagation algorithm, depending on the input skin orientation. Drawings 6 and 7 respectively illustrate the boundary curves of faces lists of drawings 4 and 5. This implementation yields list of drawing 8 because it features the shortest boundary curve.

FIG. 32 illustrates line 07 of the algorithm. Here, the input B-rep is a solid, and so the normal vector is oriented outside material. The designer selects the cylindrical face, as illustrated by drawing 1. The input B-rep appears to be displayed as a depressed shape, and the cylindrical face of the hole-shaped part of the B-rep is particularly visible to the user and easy for him/her to select. Drawings 2 and 3 illustrate lists $L_P$ and $L_D$ as they are computed by the propagation algorithm. Drawings 4 and 5 respectively illustrate the boundary curves of faces lists of drawings 2 and 3. Clearly, they feature the same length. This implementation yields list of drawing 4 because it features the smallest bounding box.

The invention claimed is:

1. A computer-implemented method for designing, with a CAD system, a 3D modeled object representing a mechanical part, the method comprising:
displaying a B-rep representing at least a part of the mechanical part, the B-rep having faces and edges;
selecting, by graphical user interaction, at least one face of the B-rep representing the at least the part of the mechanical part;
automatically by the CAD system, recognizing a set of faces representing a bump including the selected at least one face of the B-rep, by:
determining a first set of faces representing a depression and a second set of faces representing a protrusion, the first set of faces and the second set of faces both including the selected at least one face of the B-rep, and
selecting, among the faces representing the depression and the faces representing the protrusion, a set of faces having a shortest boundary curve perimeter and being different from both the selected at least one face and the B-rep, the selected set of faces forming the set of faces representing the bump; and
enabling automatic performance of a single and simultaneous edition of all the faces representing the bump and/or of all edges bounding those faces.

2. The method of claim 1, wherein:
the first set of faces includes a first connected set of one or more faces containing no convex internal edge and no round face, and
the second set of faces includes a second connected set of one or more faces containing no concave internal edge and no filet face.

3. The method of claim 2, wherein:
the first connected set of one or more faces is bounded by convex edges and/or round faces only, and
the second connected set of one or more faces is bounded by concave edges and/or filet faces only.

4. The method of claim 3, wherein:
the first set of faces consists in the first connected set of one or more faces, and
the second set of faces consists in the second connected set of one or more faces.

5. The method of claim 1, wherein the selected at least one face consists in one face of the B-rep.

6. The method of claim 1, wherein having a shortest boundary curve is defined as follows for any given set of faces: the given set of faces has a shortest boundary curve relatively to another given set of faces when:
the boundary curve perimeter of the given set of faces is strictly smaller than the boundary curve perimeter of the another given set of faces, or
the boundary curve perimeter of the given set of faces equals the boundary curve perimeter of the another given set of faces, and a length of a bounding box of the given set of faces is smaller than a length of a bounding box of the another given set of faces.

7. The method of claim 6, wherein the selecting of a set of faces further comprises:
determining whether either the first set of faces consists in the selected at least one face or the second set of faces consists in the selected at least one face, and
determining whether either the first set of faces forms a B-rep or the second set of faces forms the B-rep, then
when neither the first set of faces nor the second set of faces forms the B-rep, and when neither the first set of faces nor the second set of faces consists in the selected at least one face:
determining whether the boundary curve perimeter of the first set of faces equals the boundary curve perimeter of the second set of faces, and
when the boundary curve perimeter of the first set of faces equals the boundary curve perimeter of the second set of faces, comparing a length of a bounding box of the first set of faces and a length of a bounding box of the second set of faces.

8. The method of claim 1, wherein the B-rep is an open B-rep.

9. The method of claim 8, wherein the B-rep corresponds to a physical surface of the mechanical part.

10. The method of claim 1, wherein the mechanical part is one or more selected from a group consisting of:
a molded part,
a machined part,
a drilled part,
a turned part,
a forged part,
a stamped part, and
a folded part.

11. The method of claim 1, wherein the bump is one or more selected from a group consisting of:
a mass reduction feature,
a space reservation feature,
a fixture feature,
a tightness feature,
an adjustment feature,
a positioning feature, a mechanical joint feature,
a cooling feature,
a revolute or cylindrical mechanical joint feature,
an assembly feature,
a stiffening feature, and
a support for all machined and drilled protrusion feature.

12. An non-transitory computer readable data storage medium having recorded thereon a computer program including instructions for performing a method for designing, with a CAD system, a 3D modeled object representing a mechanical part, the method comprising:
    displaying a B-rep representing at least a part of the mechanical part, the B-rep having faces and edges;
    selecting, by graphical user interaction, at least one face of the B-rep representing the at least the part of the mechanical part;
    automatically by the CAD system, recognizing a set of faces representing a bump including the selected at least one face of the B-rep, by:
        determining a first set of faces representing a depression and a second set of faces representing a protrusion, the first set of faces and the second set of faces both including the selected at least one face of the B-rep, and
        selecting, among the faces representing the depression and the faces representing the protrusion, a set of faces having a shortest boundary curve perimeter and being different from both the selected at least one face and the B-rep, the selected set of faces forming the set of faces representing the bump; and
    enabling automatic performance of a single and simultaneous edition of all the faces representing the bump and/or of all edges bounding those faces.

13. The non-transitory computer readable data storage medium of claim 12, wherein:
    the first set of faces includes a first connected set of one or more faces containing no convex internal edge and no round face, and
    the second set of faces includes a second connected set of one or more faces containing no concave internal edge and no filet face.

14. The non-transitory computer readable data storage medium of claim 13, wherein:
    the first connected set of one or more faces is bounded by convex edges and/or round faces only, and
    the second connected set of one or more faces is bounded by concave edges and/or filet faces only.

15. The non-transitory computer readable data storage medium of claim 14, wherein:
    the first set of faces consists in the first connected set of one or more faces, and
    the second set of faces consists in the second connected set of one or more faces.

16. The non-transitory computer readable data storage medium of claim 12, wherein the selected at least one face consists in one face of the B-rep.

17. A computer comprising:
    a processor coupled to a memory and a graphical user interface, the memory having recorded thereon a computer program including instructions for designing, with a CAD system, a 3D modeled object representing a mechanical part, that when executed by the processor causes the processor to be configured to:
        display a B-rep representing at least a part of the mechanical part, the B-rep having faces and edges,
        select, by graphical user interaction, at least one face of the B-rep representing the at least the part of the mechanical part,
        automatically by the CAD system, recognize a set of faces representing a bump including the selected at least one face of the B-rep, by:
            determining a first set of faces representing a depression and a second set of faces representing a protrusion, the first set of faces and the second set of faces both including the selected at least one face of the B-rep, and
            selecting, among the faces representing the depression and the faces representing the protrusion, a set of faces having a shortest boundary curve perimeter and being different from both the selected at least one face and the B-rep, the selected set of faces forming the set of faces representing the bump; and
    enable automatic performance of a single and simultaneous edition of all the faces representing the bump and/or of all edges bounding those faces.

18. The computer of claim 17, wherein:
    the first set of faces includes a first connected set of one or more faces containing no convex internal edge and no round face, and
    the second set of faces includes a second connected set of one or more faces containing no concave internal edge and no filet face.

19. The computer of claim 18, wherein:
    the first connected set of one or more faces is bounded by convex edges and/or round faces only, and
    the second connected set of one or more faces is bounded by concave edges and/or filet faces only.

20. The computer of claim 19, wherein:
    the first set of faces consists in the first connected set of one or more faces, and
    the second set of faces consists in the second connected set of one or more faces.

* * * * *